(12) United States Patent  
Lehmann

(10) Patent No.: US 9,379,757 B2  
(45) Date of Patent: Jun. 28, 2016

(54) DEVICE FOR REFLECTING MICROWAVE WAVES IN WAVE CANCELLING INTERFERENCE PATTERNS

(71) Applicant: Harry V Lehmann, Novato, CA (US)

(72) Inventor: Harry V Lehmann, Novato, CA (US)

(73) Assignee: Green Swan, Inc., Novato, CA (US)

( * ) Notice: Subject to any disclaimer, the term of this patent is extended or adjusted under 35 U.S.C. 154(b) by 91 days.

(21) Appl. No.: 14/285,556

(22) Filed: May 22, 2014

(65) Prior Publication Data

US 2015/0311936 A1  Oct. 29, 2015

Related U.S. Application Data

(60) Provisional application No. 61/826,359, filed on May 22, 2013.

(51) Int. Cl.
*H04M 1/00* (2006.01)
*H04B 1/3827* (2015.01)
*H04M 1/02* (2006.01)

(52) U.S. Cl.
CPC ........... *H04B 1/3838* (2013.01); *H04M 1/0202* (2013.01)

(58) Field of Classification Search
USPC ....................................... 455/575.5, 300, 304
See application file for complete search history.

(56) References Cited

U.S. PATENT DOCUMENTS

| | | | | |
|---|---|---|---|---|
| 5,826,201 A | * | 10/1998 | Gratias | H01Q 1/245 343/702 |
| 6,564,038 B1 | * | 5/2003 | Bethea | H05K 9/00 343/702 |
| 2002/0008670 A1 | * | 1/2002 | Sharman | H01Q 1/42 343/840 |
| 2004/0023682 A1 | * | 2/2004 | Lee | H01Q 1/245 455/550.1 |
| 2006/0233356 A1 | * | 10/2006 | Lu | H04B 1/3838 379/433.01 |
| 2009/0102726 A1 | * | 4/2009 | Imano | H01Q 1/242 343/702 |
| 2011/0090126 A1 | * | 4/2011 | Szini | H01Q 1/245 343/702 |
| 2011/0157859 A1 | * | 6/2011 | Lehmann | H01Q 1/245 361/816 |

* cited by examiner

*Primary Examiner* — Edward Urban
*Assistant Examiner* — Ralph H Justus
(74) *Attorney, Agent, or Firm* — Duane Morris LLP

(57) ABSTRACT a radio case device intended for use upon, or integrated into, a cellular smart phone device. The installation of a stacked tubular or semi-tubular circumferential reflective elements within the top of the case of such case device results in overlapping omnidirectional reflected time phased re-broadcast of received signal of origin from the microwave or radio device. The re-broadcast signals or reflected signals provide a circumferential omnidirectional signal reflections from differing levels of depth (and accordingly differing distances from signal source) with fractal subdivisions from each depth of element. This creates multiple, interactive, layered and fractal interference patterns, resulting in reduced signal penetration in the area of the end user's body and head).

17 Claims, 7 Drawing Sheets

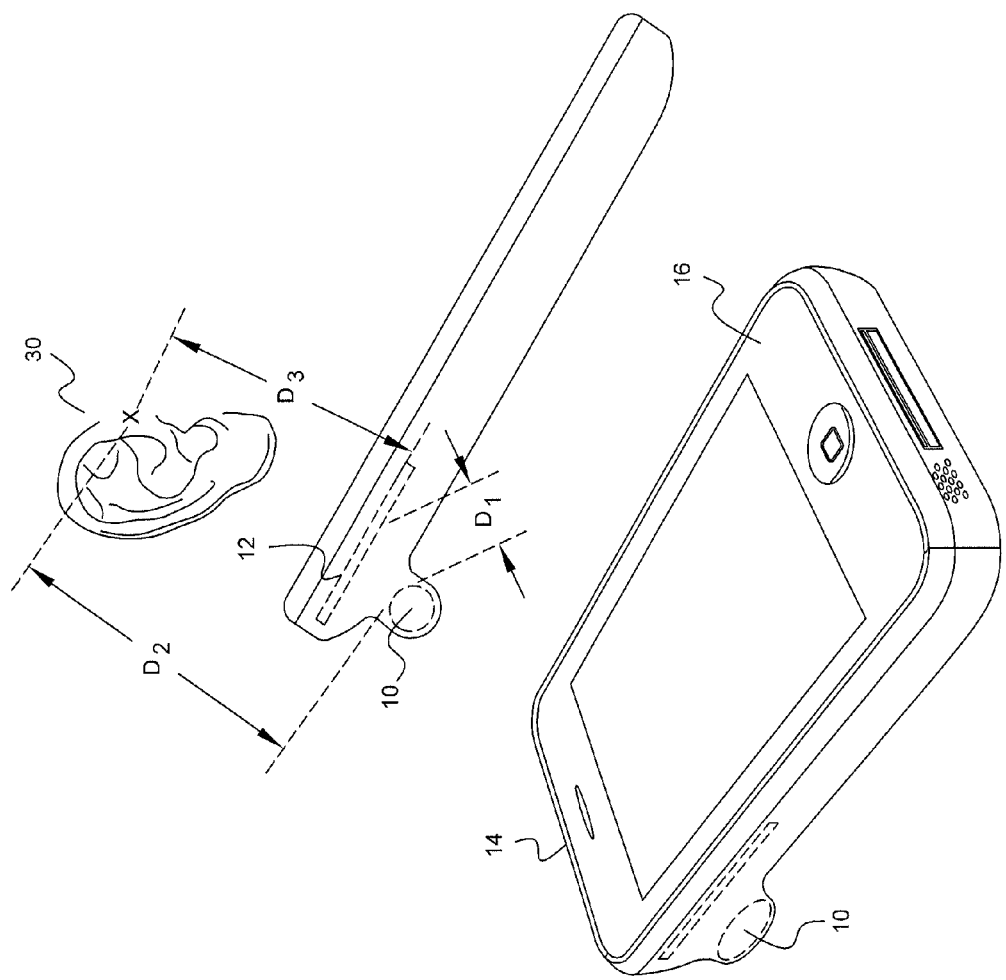

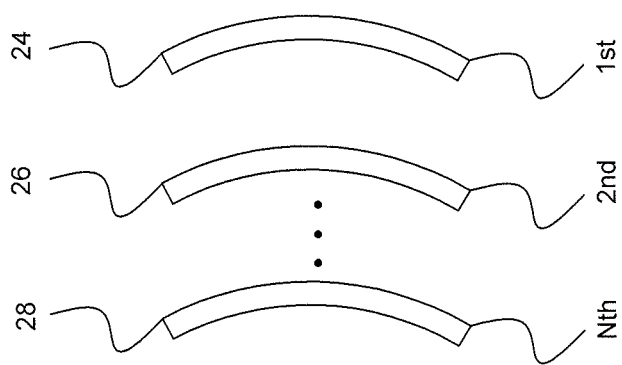
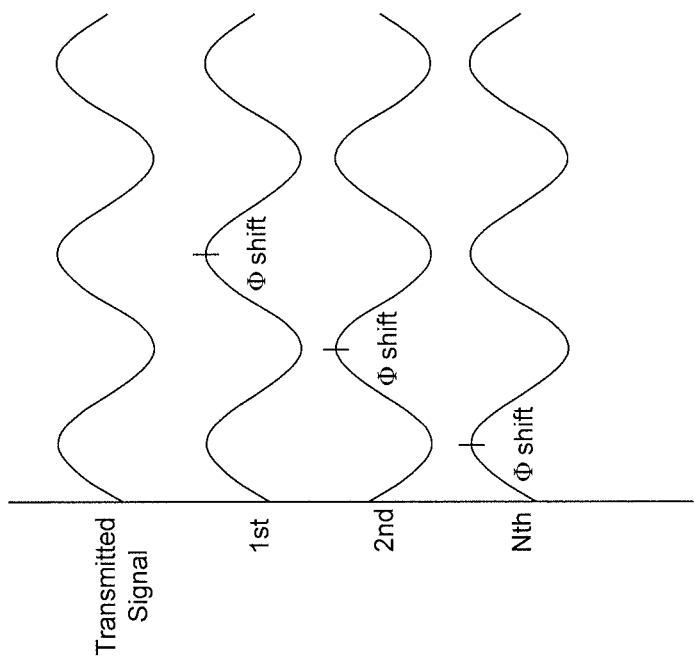
FIG 3A
FIG 3B

DEVICE FOR REFLECTING MICROWAVE WAVES IN WAVE CANCELLING INTERFERENCE PATTERNS

CROSS REFERENCE

The present application also claims priority benefit of U.S. Provisional Application No. 61/826,359 filed 22 May 2013 entitled "Device for Reflecting Microwave Waves in Wave Cancelling Interference Patterns," the entirety of which is incorporated herein by reference.

BACKGROUND

The need for the present invention is clearly apparent. A growing body of evidence indicates that the non-ionizing radiation from cellular devices, particularly over long term use, or particularly in the instance of children and teens whose skulls have not hardened (and whose heads are typically smaller in volume).

Substantial empirical research demonstrates a positive correlative relationship between close exposure to cellular telephone microwave signal and physiological changes sometimes associated with deterioration in human health. The relationship between microwave signal from cellular devices and health is not controversial, though the extent and type of such relationship remains debated.

The fact of such a relationship is non-controversial is demonstrated by the presence of warnings in the supporting documentation sold with all or most cellular devices. Typically a small booklet is deployed to the consumer at the point of sale in packaged company with the sold cellular device. In some other instances, particularly with one manufacturer, the paper documentation is slight, but the end user is directed to descriptive materials, corresponding in practical effect to a user's manual. In pertinent point, the user's manuals sold with cellular devices in the United States, Europe, and elsewhere contain concise warnings to the consumer based upon a testing regime called Specific Absorption Rate, which is the industry-accepted criteria for the measurement of projected risk from exposure to cellular devices. Below are sample industry defined in 2011 as safe distances, based upon an industry standard expectation of a maximum of 1.6.

| CELL PHONE MODEL | SAR (HEAD) | SAR (BODY) | MIN Spatial Distance |
| --- | --- | --- | --- |
| HTC Evo 3D | 0.88 W/kg @1 g | 1.11 W/kg @1 g | 0.40 inches (1 cm) |
| HTC Sensation 4G | 1.40 W/kg @1 g | 0.70 W/Kg @1 g | 0.59 inches (1.5 cm) |
| T-Mobile My Touch 4G | 0.94 W/kg @1 g | 1.03 W/kg @1 g | None obtainable |
| HTC Thunderbolt | 1.20 W/kg @1 g | 1.46 W/kg @1 g | 0.50 inches (1.3 cm) |
| Motorola Droid Bionic | 0.88 W/kg @1 g | 0.94 W/kg @1 g | 1.00 inches (2.5 cm) |
| T-Mobile G2x | 0.83 W/kg @1 g | 0.72 W/kg @1 g | 0.79 inches (2 cm) |
| Motorola Atrix 4G | 1.47 W/kg @1 g | 1.35 W/kg @1 g | 1.00 inches (2.5 cm) |
| Apple Iphone 4G | 0.97 W/kg @1 g | 0.69 W/kg @1 g | 0.62 inches (1.55 cm) |
| Motorola Phantom 4G | 0.93 W/kg @1 g | 0.91 W/kg @1 g | 1.00 inches (2.5 cm) |
| Samsung Charge | 1.01 W/kg @1 g | 1.00 W/kg @1 g | 0.59 inches (1.5 cm) |

While the industry standards for such distances are typically stated as being in reference to the risks of heat accumulation from microwave induced vibration ("slow cook"), other scientific studies have empirically demonstrated the existence of a direct relationship between the non-ionizing radiation from cellular devices and physiological changes in the bodies of the users of cellular telephones, including the head and brain. Thus, an article just published in the Journal Of The American Medical Association (JAMA), titled Effects of Cell Phone Radiofrequency Signal Exposure on Brain Glucose Metabolism, written by a team of scientists from the National Institutes of Health, headed by Nora D. Volkow.

As stated in the Abstract (http:1/jama.ama-asn.org/content/305/8/808), published on Feb. 23, 2011, the Volkow team found that "50-minute cell phone exposure was associated with increased brain glucose metabolism in the region closest to the antenna," which increased glucose metabolism were in term visible on MRI examination. The Volkow findings are significant in that they document actual direct non-thermal effect, the very existence of which had sometimes been contested, despite prior studies and evidence to the contrary.

The ultimate significance of this new JAMA study is that while some in the cellular telephone industry had previously asserted that there was no possible direct effect upon the brain from cellular telephone exposure, the Volkow study found a direct relationship between cellular telephone use and brain metabolism, long before the levels of radio wave exposure necessary to generate heat.

On Apr. 24, 2013 the International Agency For Research On Cancer of The World Health Organization, announced its findings classifying cellular telephone electromagnetic field exposure as a possible carcinogen. These forms of electromagnetic radiation have been categorized as a Group 2B carcinogen along with lead, automobile exhaust and other toxic substances. A summary of the findings of this just-published monograph can be found at: http://monograph-s.iarc.fr/ENG/Monographs/vol102/mono102-005-006.pdf Internationally esteemed environmental scientist Joel M. Moskowitz in his press release on the newly-released WHO standards notes that, according to the monograph "Positive associations have been observed between exposure to radiofrequency radiation from wireless phones and glioma and acoustic neuroma" (p.421), and: "Radio frequency electromagnetic fields are possibly carcinogenic to humans (Group 2B)." (p. 421). Dr. Moskowitz also noted in his April 24 publication that; Children are particularly vulnerable as "the average exposure from use of the same mobile phone is higher by a factor of 2 in a child's brain and higher by a factor of 10 in the bone marrow of the skull." Also, the child's brain is developing at a much greater rate than the adult's brain.

Many empirical studies have by demonstrated physical effect, such as the work of Dr. Henry Lai at The University of Washington, the Lund University experiments, and many others. Many other studies show that a solid empirical basis for concern about the effects of modulated microwave on human tissue [i.e. H. Lai et al, from the University of Washington, 1984, 1988, and as presented in 1998) Vienna, Austria, and 2009 in Stavanger, Norway; O. Johansson, Associate Professor, Dept. of Neuroscience of the Karolinska Institute, Stockholm, and Professor, Royal Institute of Technology, Stockholm, as presented in 2009 at Stavanger, Norway; Carl F. Blackman a founder of. the Bioelectromagnetics Society, as presented in 2009, at Stavanger, Norway; Martin Blank, Ph.D., Associate Professor, Columbia University, as presented in 2009 Stavanger, Norway, Franz Adlkofer, M.D., doctorate from the Max Planck Institute for Biochemistry as presented at Stavanger Norway, 2009, also the following presenters at the International E:tv1F Conference 2009 at Stavanger) Norway: Lukas H. Margaritis, Ph.D, Greece; Elihu D. Richter, MD, M.PH., Israel; Alvaro Agusto A. de Salles, Ph.D., Brazil; Fredrik Soderqvist, Ph.D., Sweden, Yuri G. Grigoriev M, D. Sci., Russia; Anton V. Merkulov Ph.D., Russia], have shown potential health risks, in some instances showing DNA breakage associated with human exposure to non-ionizing radio wave sources, including but not limited to those emitted from mobile telephone devices and handsets, including but not limited to cellular telephones.

More recent scientific writing in this regard, including in 2012 and 2013 has underlined a causal relationship between extended exposure to pulsed microwave signals and human health. Such recent findings have included the Jul. 12, 2012 letter from the President of the American Academy of Pediatrics, Robert W. Block, MD, FAAP, to The Honorable Julius Genachowski, Commissioner, Federal Communications Commission, in which, on behalf of the American Academy of Pediatrics the FCC was again notified that: "In the past few years, a number of American and international health and scientific bodies have contributed to the debate over cell phone radiation and its possible link to cancer. The International Agency for Research on Cancer (IRAC), part of the United Nations World Health Organization, said in June 2011 that a family of frequencies that includes mobile-phone emissions is "possibly carcinogenic to humans." The letter does state that cell phones cause cancer, but cites academic reasons for concern justifying further study.

See also the findings of Board Certified Pediatric Neurologist at the Harvard Medical School Martha R. Herbert, who states in her letter to the Los Angeles Unified School District dated Feb. 8, 2013, referencing her 60 page study with over 550 citations which can be found at: www.bioinitiative.org/report/wpcontent/uploads/pdfs/sec20_2012 findings_in_Autism.pdf.

In the above referenced letter, as found in the study to which it refers Dr. Herbert finds that EMF/RFR from wifi and cell towers can exert a disorganizing effect on the ability to learn and remember, and can also be destabilizing to immune and metabolic function." This letter and the study crucially indicate that the effects involved are non-thermal, meaning that they do not result from the microwave heating of tissue but are biological changes resulting directly from microwave contact with the tissues involved.

The recent work at the Kaiser Permanente Division of Research by De-Kun Li, 110, PhD, MPH has shown in a study in which 733 women were given a meter to carry during pregnancy, and their EMF exposure was measured, that, after 13 years, childhood obesity was greater in the children whose mothers had higher E11F readings than in those whose mothers had lower EMF readings, and that the change in obesity outcome was dose-responsive, with a 2.3 fold increased risk in children who were followed until the end of the study after thirteen years.

On Apr. 24, 2013 IARC, being the international cancer research arm of The World Health Organization, issued its monograph of more than four hundred pages, and contributed to by many scientists, in which it was announced that cellular telephone non-ionizing radiation signal is now classified as a Group 2B carcinogen. This recent announced standard and many other sources of scientific data (see the work of Dr. Henry Lai, University of Washington including as in JAMA, the work of Dr. Devra Davis in the book Disconnect, the work of Dr. Olle Johansson of the Karolinska Institute of Stockholm, the low-wattage study in rats from Lund University, Sweden, the Feb. 8, 2013 letter from a board certified pediatric neurologist at the Harvard Medical School to the Superintendent of Public Instruction for Los Angeles, the studies which can be located at wv-rw.bioinitiativereport.org). These data show that mitigation of signal entering the human body from cellular devices can be reasonably expected to reduce risk to the health of persons using such devices. The instant Invention achieves such mitigation by the System and Method herein Disclosed and the Claims herein made.

Thus, a considerable body of work briefly touched upon here shows an empirical basis for the concern that pulsed microwave has non-thermal results upon human health. There is, further, a considerable body of evidence indicating that close proximity, due to the operation of The Inverse Square Rule, will result in much higher dosage levels will occur, such as from cellular devices, when they are held close to the body or head.

Consequently, devices, such as the within unique invention here filed) which provide fine sound quality, while also providing for increased distance between the body (including the head) and a source of pulsed microwave (such as a 3G or 4G mobile phone) will indisputably provide, due to The Inverse Square Rule, the user with a reduced level of absorbed microwave.

Cellular devices now in the possession six billion customers. The value of the invention here filed resides from that vast pool of users for reasons which include the following: 1) The invention unquestionably reduces the level of radiation to which the mobile phone users brain is exposed, due to the operation of the inverse square law, or sometimes stated as the inverse square rule, that the strength of the radio signal is inverse to the square of the distance from the source, which results in very rapid falloff of signal density, including as absorbed, and: 2) While simultaneously aiding the safety of cellular phone users, the invention assists the cellular telephone industry in avoiding liability, because of reduced exposure due to reduced number and severity of injury, and because of the quality of warning which results from dispensing the product, which increased quality of warning has an insulating effect, and: 3) In addition to the possible benefits to users, market and ethical value in the invention stemming from education of persons who may not directly benefit from the use of proximity avoidance from a radiation reduction standpoint, but who nonetheless gain peace of mind through taking various prudent steps towards limitation of EMF contact, including those who merely witness the invention being used by others.

The antennae of cellular smart phone devices are now typically integrated into the device as a whole, and very typically deployed at the rear circumferential periphery of such devices. Smart phone, mobile device, cellular phone, radio etc. are used interchangeable to describe a personal device that has a transceiver and no particular distinction should be implied between them.

Current antennae are omnidirectional, and emit microwave signal in a generally spherical pattern from the antennae. Because the emission of the outgoing microwave signal is spherical, such signal necessarily emits into the body of the end user of such devices, and when such devices are in use and near the head, this spherical characteristic of microwave broadcast causes microwave entry into the head of the user.

While it is true that in the more modern, and most American systems, the CDMA approach to cellular frequency is employed, which operates at very low wattage in urban settings. However, it is also the case that when the nearest cellular tower is distant, and the signal-from-tower correspondingly weak, there is an exponential multiplication of outgoing signal strength from the CDMA handheld device.

Consequently, including in the most modern variants of the cellular device, substantial non-ionizing radiation will penetrate the head of the user when the device is in the "on"

condition and engaged in broadcast in distant-from-tower contexts, and the invention here stated will be of particular use in such distance situations, although useful in all known frequency modulation regimes.

The use of both in-phase and modified phase signal is well understood as a mechanism for the reduction of signal penetration from the direction of original signal origin. While this concept has been used in various ways, the most commonly available example of the use in the active noise reduction context, such as used in noise cancelling aviation headsets, such as originally developed by Bose, and as subsequently expanded by that company and others into noise cancellation applications for both the aviation and the consumer music markets.

Systems in use today achieve effectiveness through active means, namely the capture of incoming signal (such as ambient engine noise), and immediate amplified re-broadcast of such signal, as copied and amplified and/or phase modified in opposition to the direction of origin of the sound involved. In such circumstance, signal cancellation; often generically and commercially referred to as "noise cancellation" reduces the undesired sound perceived by the person using such active noise cancellation equipped devices.

Advantages of the present subject matter will be readily apparent to one skilled in the art to which the invention pertains from a perusal of the claims, the appended drawings, and the following detailed description of preferred embodiments.

BRIEF DESCRIPTION OF THE FIGURES

FIGS. 1A-1D illustrate mobile devices with an installation of a tubular or semi-tubular circumferential signal reflector.

FIGS. 3A and 3B illustrates multiple reflectors and their respective phase offsets.

DETAILED DESCRIPTION

Figure 1B:
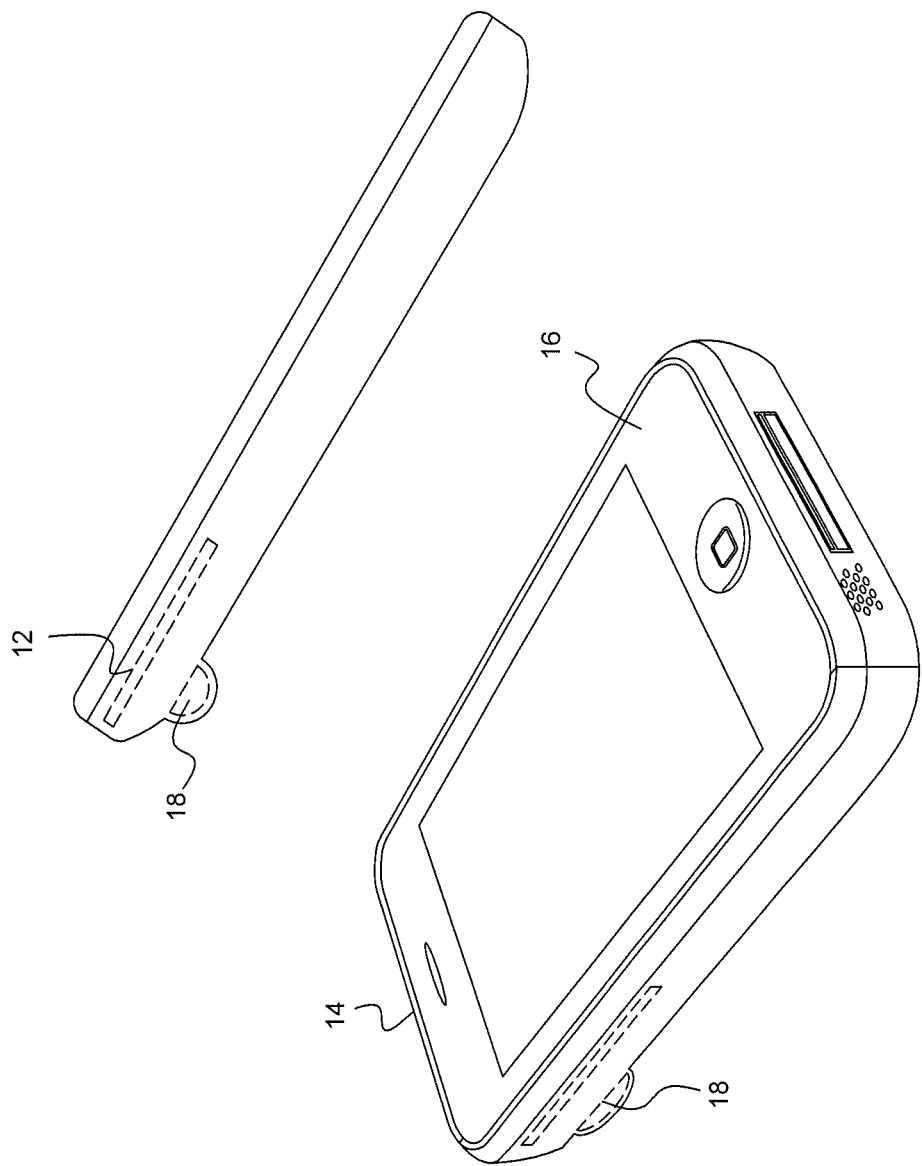

The reduction of signal strength from direction of origin can also be achieved by more passive means, such as immediate reflection of signal in the same wavelength and modulation towards the position of origin, such that a resulting interference pattern is achieved, reducing the level of signal penetration from the origin point of the signal involved.

In example, a cylindrical shaped reflecting dielectric surface, will reflect signal from the entire 180 degrees of cylindrical shape, or tube shape, which is exposed to the radio broadcast involved. In addition, modulation of phase may be achieved, if desirable, by layering of dielectric reflective material, such that slight time differential results from differing depths from first surface of materials shaped for such reflection may achieve slight time differential between layers of reflected signal where desired.

In the cellular "smart phone" context, if a cellular case (either as part of and original equipment manufacture's (OEM) cellular device, or as an aftermarket protective case, is circumferentially equipped with a passive (meaning non-electrified, non-amplified) reflective tube around the circumference of the case at the side presented to the user, not only will the area in "signal shadow" of such reflective tube receive less signal strength from the antenna of the device involved, but, as with noise cancellation in the acoustic context, resulting (and fractal) interference patterns will emerge in the reflected signal from such circumferential reflecting tubular structure, such that a resulting diminishment in signal strength penetrating the head will result therefrom.

In addition, a semi-hemispherical "half tube" structure may achieve the same effect, while, if desired, avoiding the establishment of omni-directional half spherical interference pattern potential on the side of such tube-like structure not facing the antennae with in such smart phone and similar devices.

The effects of the insertion of such reflective half tube shaped devices in adjacency or in pyramidal stacking, may achieve increases in generation of fractal and propagated divisional sub-fractal interference patterns, should such be desired.

The net sought application of the installation of such tubular and half-tubular reflective circumferential structures is the installation within cellular telephone cases, including both OEM and aftermarket cases, with the domed aspect of such circumferential tubular structures facing "back" towards the smart phone antenna (or similar microwave or other radio device) from the "top" of the case (meaning on or above a plane conjunctive with the operational screen of such device), such that signal reflected from such semi-tubular structures will create interactive interference patterns with the signal of origin from the circumferential antennae at the rear or side of such cellular devices, such that signal density emerging towards the user from the combination of such circumferential semi-tubular or tubular case installations and a given cellular smart phone to the direction of the user is lower than will occur with the use of an identical cellular smart phone not so equipped with such reflective structures as herein described.

Figure 1C:
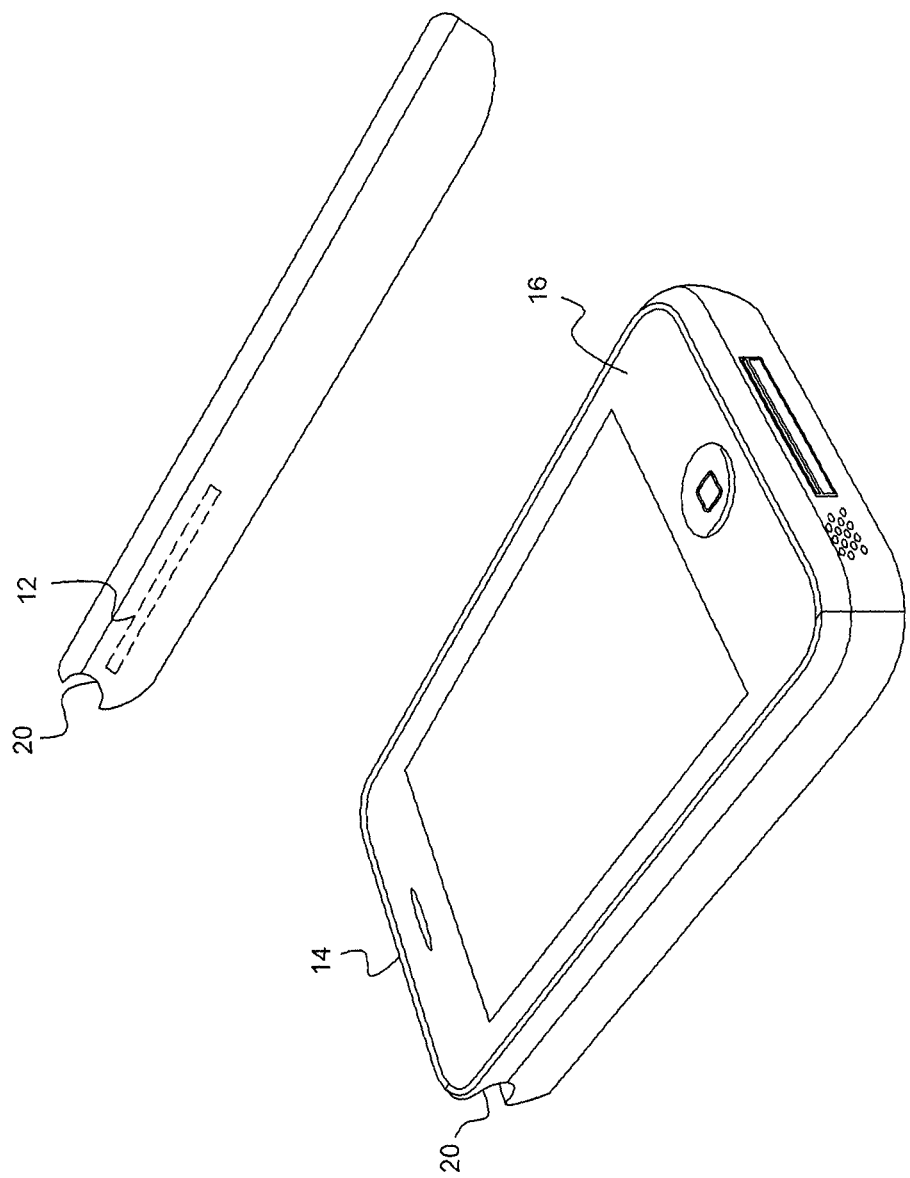
Figure 1D:
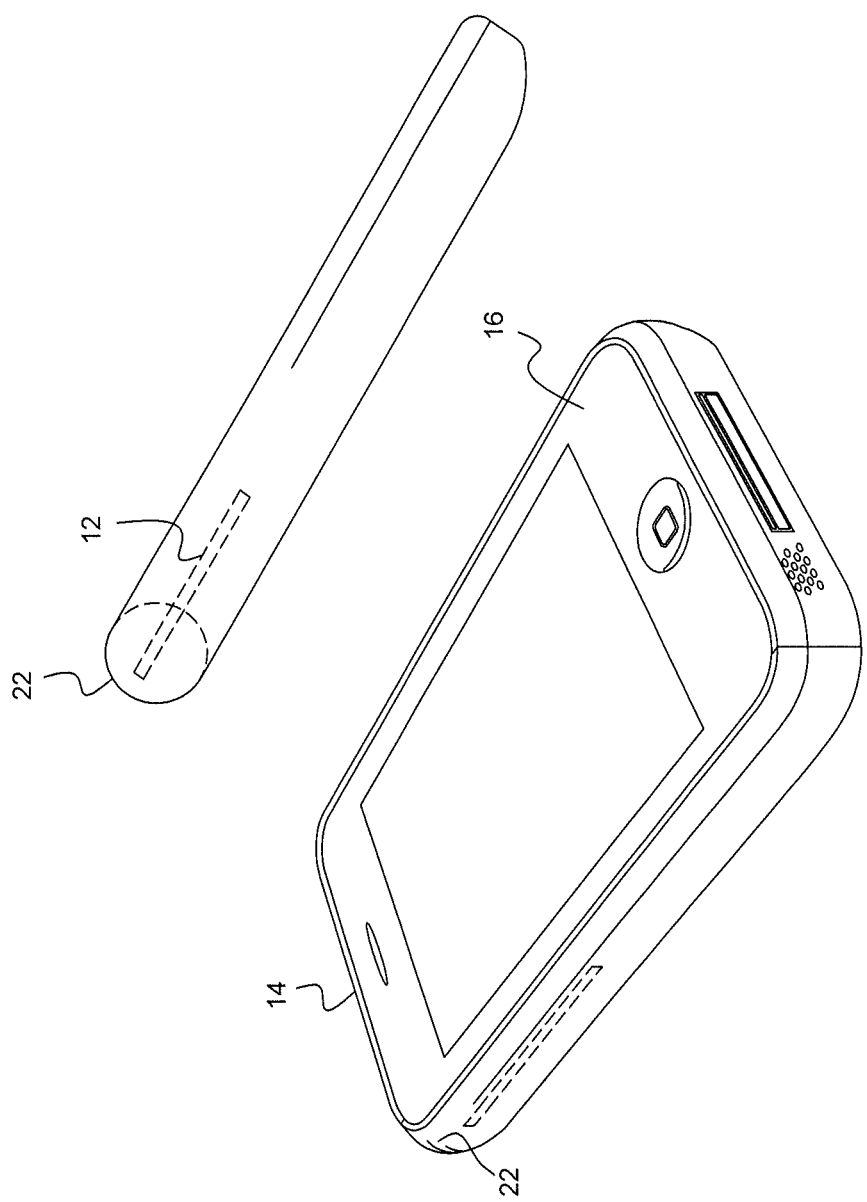

As illustrated in FIGS. 1A-D a radio case device 14, including but not limited to a case intended for use upon, or to contain, or integrated into, a cellular smart phone device 16, such that the installation of a tubular 10 or semi-tubular circumferential reflective element 18 within the top of the case 14 of such case device results in the omnidirectional reflected re-broadcast of received signal of origin from the antenna 12 of the microwave or radio device 16 into which such case device is installed (at manufacturer or in aftermarket) such that a circumferential omnidirectional signal bounce, with fractal subdivisions thereof occurs, reducing signal penetration in the area of the end user's body and head. FIGS. 1C and 1D show the reflector 20 and 22 respectively integrated into the top portion of the mobile device 16.

FIG. 1A shows the proximate location of the users ear 30, along with its distance from the antenna $D_3$: the distance from the reflector 10 $D_2$ and the distance between the reflector 10 and the antenna $D_1$. These relative positions are determinative of the passive destructive interference in the discloses subject matter.

Figure 2A:
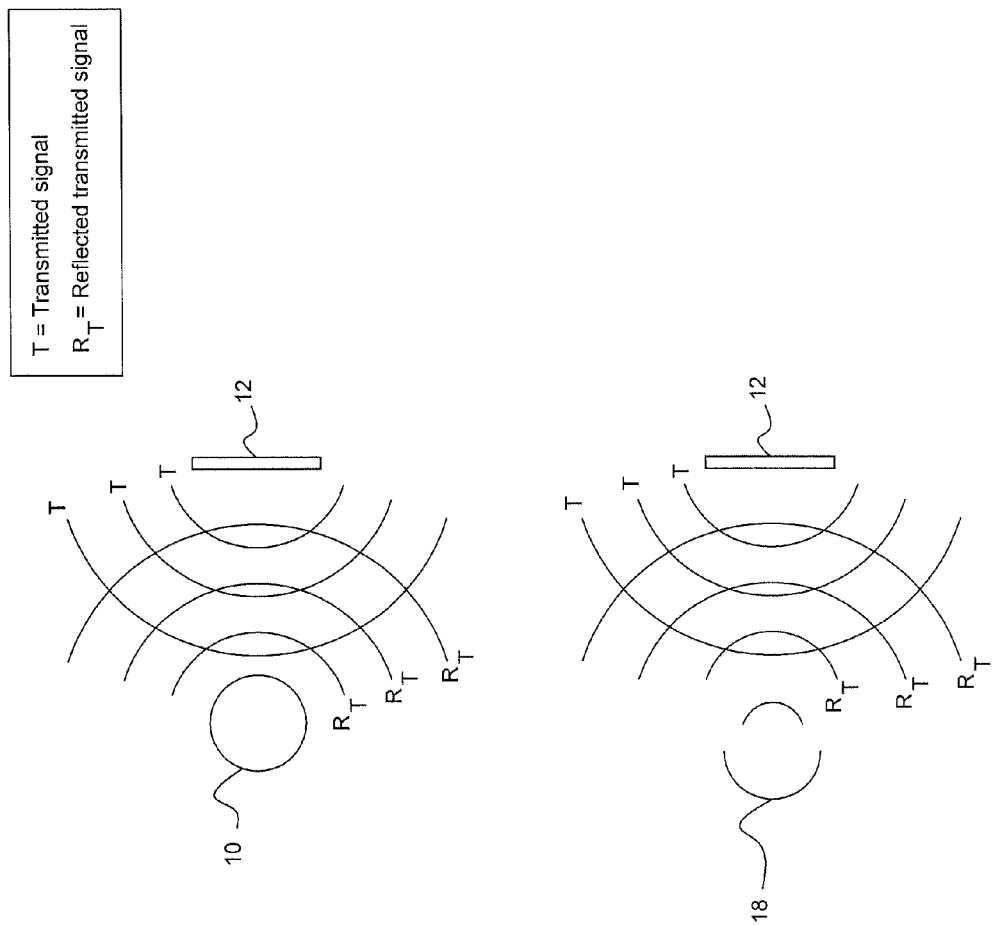
FIGS. 2A and 2B illustrate the propagation of the communication signal to and from the reflector.

As illustrated in FIG. 2A the transmitted signal from antenna 12 is reflected omni-directional from reflector 10, whereas the transmitted signal from antenna 12 is reflected more narrowly by reflector 18.

Figure 2B:
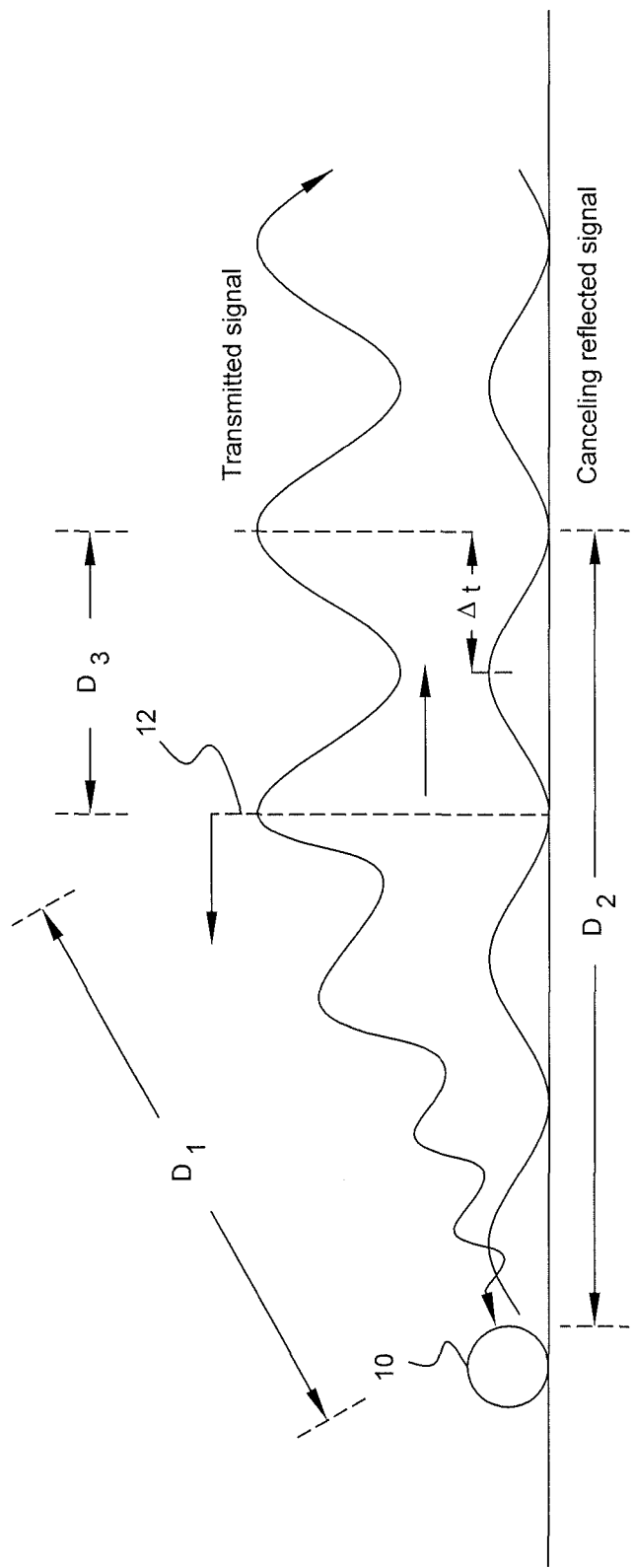

FIG. 2B illustrates the destructive interference pattern of the cancelling reflected signal and the transmitted signal. The $\Delta T$ is the time delay between the original transmitted signal and the reflected signal. The time delay is a function of the difference propagation distance. The reflected signal having been transmitted to reflector 10 over distance $D_1$ and then reflected over distance $D_2$, whereas the transmitted signal propagated over $D_3$. Because of the larger distance traveled by the reflected signal, the amplitude will be reduced compared to the transmitted signal.

In FIG. 3 the reflector is comprised of multiple individual reflectors or reflector layers. The first layer 24, second layer 26 and n<sup>th</sup> layer 28. Because the distance from the antenna 12 and varying proximate position 30 of the users ear, each reflected signal will have a different respective phase shift, as shown in FIG. 3 which will be effective at destructive interference at different proximate positions. Thus providing a range of protection. Care should be provided such that the shift is such that constructive interference is created by the multiple layers.

As illustrated in FIGS. 2 and 3 with fractal subdivisions thereof occurs, not only reducing signal penetration in the shadow of such device (and thus in the area of the end user's body and head), but by the omnidirectional reflected re-broadcast of such signal of origin from such thereby contained cellular device, such tubular or semi-tubular reflective element causes the establishment of interference patterns within the area between such circumferential reflective semi-tubular installation and the antenna of original signal origin, such that the resulting interference pattern, inevitably fractal layered in character, serves (said interference pattern) to reduce the extent to which signal of origin from the contained antenna reaches the body of the end user, and the head of the end user. For purposes here-described, the claims here are asserted both for wave interference patterns resulting from such installation of such circumferential semi-tubular element and for resulting "microwave photon" interference patterns resulting from said installation of such circumferential semi-hemispherical, or semi-tubular elements within the user-facing top of such cellular (and other) device cases as here described. As illustrated in FIG. 3, differing levels of depth (and accordingly differing distances from signal source) with fractal subdivisions from each depth of element therefrom occurs, thereby creating multiple, interactive, layered and fractal interference patterns, resulting in reduced signal penetration in the area of the end user's body and head).

For a case in which circumferential installation of a half tube shaped dielectric material is used as described above, but that the element involved is electrically charged, including not only mere direct charging, but also amplified and/or pulsed charging as keyed by incoming signal.

For a circumferential element at the top of a cellular telephone or other radio case, composed of reflective dielectric materials, where orthogonal shapes are used, including shapes other than a presented dome, such that reflection is directed at angels other than the omni-directional 180 degree reflection patterns resultant from a half tube shaped element, including but not limited to 45 degree tent shapes, octagonal shapes, and other shapes intended to achieve enhance reflectivity and/or enhanced resulting interference patterns, in conjunction with semi-tube circumferential elements as described in claim 3 above, or without such conjunction.

The disclosed subject matter includes the method for attenuating the communication signals transmitted from a mobile devices antenna in the proximity of the mobile device's ear piece includes determining the position of the antenna; determining the position of the ear piece relative to the antenna; determining a phase different required to create destructive interference with the communication signal at a position proximate the ear piece; positioning a reflector such that the propagation of the communication signal to the reflector and the propagation of a reflected communication signal from the reflector to the position proximate the ear piece results the phase difference between the communication signal and the reflected communication signal at the position proximate the ear piece:

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What I claim is:

1. A method for attenuating the communication signals transmitted from a mobile device's antenna in the proximity of the mobile device's ear piece, the method comprising:
   determining the position of the antenna;
   determining the position of the ear piece relative to the antenna;
   determining a phase shift required to create destructive interference with the communication signal at a position proximate the ear piece;
   positioning a reflector such that the propagation of the communication signal to the reflector and the propagation of a reflected communication signal from the reflector to the position proximate the ear piece results in the phase difference between the communication signal and the reflected communication signal at the position proximate the ear piece:
   wherein the reflector is attached to the mobile device;
   wherein the phase difference is $(2n-1)\lambda/2$, where n is an integer.

2. The method of claim 1, the reflector is semi-tubular.

3. The method of claim 1, wherein the reflector is tubular.

4. The method of claim 1, wherein the reflector is attached to the mobile device via a case.

5. The method of claim 1, wherein the reflector comprises a plurality of reflectors.

6. The method of claim 5, further comprising a plurality of positions proximate the ear piece and wherein each of the plurality of the reflector is associated with a respective one of the plurality of positions proximate the ear piece.

7. The method of claim 1 wherein the reflector is integrated in the mobile device.

8. The method of claim 1, wherein the reflector is removably attached.

9. The method of claim 1, wherein the position of the reflector is determined according to the following function:

$$(D_1+D_2-D_3)=(2n-1)\lambda/2$$

where $D_1$ is the distance between the antenna and the reflector, $D_2$ is the distance between the reflector and the position proximate the ear piece; $D_3$ is the distance between the antenna and the position proximate the ear piece; $\lambda$, is the wavelength of communication signal and n is a positive integer and wherein $D_1$ $D_2$ and $D_3$ are within a common plane.

10. A method for attenuating the communication signals transmitted from a mobile device's antenna in the proximity of the mobile device's ear piece, the method comprising:
   determining the position of the antenna;
   determining the position of the ear piece relative to the antenna;
   determining a phase shift required to create destructive interference with the communication signal at a position proximate the ear piece;
   positioning a reflector such that the propagation of the communication signal to the reflector and the propagation of a reflected communication signal from the reflector to the position proximate the ear piece results in the phase difference between the communication signal and the reflected communication signal at the position proximate the ear piece;
   wherein the reflector is attached to the mobile device;

wherein the phase difference is (2n−1)λ/2, where n is an integer
wherein the reflector comprises a plurality of reflectors;
a plurality of positions proximate the ear piece and wherein each of the plurality of the reflector is associated with a respective one of the plurality of positions proximate the ear piece;
further comprising positioning each of the plurality of reflectors such that the propagation of the communication signal to each respective reflector and the propagation of a respective reflected communication signal from the respective one of the plurality of reflectors to the respective position proximate the ear piece results the phase difference between the communication signal and the reflected communication signal at each of the respective positions proximate the ear piece.

11. A mobile device comprising
an antenna;
a transmitter operably connected to the antenna;
an ear piece;
wherein the ear piece is positioned proximate a user's ear when in the mobile device is in use;
a reflector positioned at predetermined location relative to the ear piece and the antenna;
wherein the predetermined location is a function of the position of the antenna, the ear piece and the frequency band of the radio transceiver;
wherein the function of the position of the antenna, the ear piece and the frequency band of the radio transceiver is governed by:

$$(D_1+D_2-D_3)=(2n-1)\lambda/2$$

where $D_1$ is the distance between the antenna and the reflector, $D_2$ is the distance between the reflector and the position proximate the ear piece; $D_3$ is the distance between the antenna and the position proximate the ear piece; λ is the wavelength of communication signal and n is a positive integer and wherein $D_1$ $D_2$ and $D_3$ are within a common plane.

12. The device of claim 11, the reflector is semi-tubular.

13. The mobile device of claim 11, wherein the reflector is tubular.

14. The mobile device of claim 11, wherein the reflector is attached to the mobile device via a case.

15. The mobile device of claim 11, wherein the reflector comprises a plurality of reflectors.

16. The mobile device of claim 11 wherein the reflector is integrated in the mobile device.

17. The mobile device of claim 11, wherein the reflector is removably attached.

* * * * *